(12) United States Patent
Seriu et al.

(10) Patent No.: US 7,971,792 B2
(45) Date of Patent: *Jul. 5, 2011

(54) BEARING WITH IC TAG AND SEAL FOR THE SAME

(75) Inventors: Makoto Seriu, Kuwana (JP); Seiichi Takada, Kuwana (JP)

(73) Assignee: NTN Corporation, Osaka (JP)

( * ) Notice: Subject to any disclaimer, the term of this patent is extended or adjusted under 35 U.S.C. 154(b) by 1253 days.

This patent is subject to a terminal disclaimer.

(21) Appl. No.: 10/580,482

(22) PCT Filed: Nov. 22, 2004

(86) PCT No.: PCT/JP2004/017368
§ 371 (c)(1),
(2), (4) Date: May 24, 2006

(87) PCT Pub. No.: WO2005/052397
PCT Pub. Date: Jun. 9, 2005

(65) Prior Publication Data
US 2007/0115131 A1    May 24, 2007

(30) Foreign Application Priority Data
Nov. 25, 2003 (JP) .................................. 2003-393361

(51) Int. Cl.
*G06K 19/06* (2006.01)
(52) U.S. Cl. ........................................ 235/492; 235/487
(58) Field of Classification Search .................. 235/492, 235/486, 487; 340/447, 572.8, 870.3
See application file for complete search history.

(56) References Cited

U.S. PATENT DOCUMENTS

| 6,002,248 | A | * | 12/1999 | Binder ......................... 324/160 |
| 6,018,299 | A |   | 1/2000 | Eberhardt |
| 6,076,737 | A | * | 6/2000 | Gogami et al. ............... 235/492 |
| 6,091,332 | A |   | 7/2000 | Eberhardt et al. |
| 6,107,920 | A |   | 8/2000 | Eberhardt et al. |
| 6,130,613 | A |   | 10/2000 | Eberhardt et al. |
| 6,160,526 | A | * | 12/2000 | Hirai et al. .................... 343/895 |
| 6,173,210 | B1 |  | 1/2001 | Bjornson et al. |

(Continued)

FOREIGN PATENT DOCUMENTS

JP   2002-155933   5/2002

(Continued)

OTHER PUBLICATIONS

Patent Abstracts of Japan 2004-263724 dated Sep. 24, 2004 (2 pages).
Patent Abstracts of Japan 2002-298116 dated Oct. 11, 2002 (2 pages).
International Search Report for PCT/JP2004/017368 dated Mar. 29, 2005 (2 pages).
U.S. Office Action issued for U.S. Appl. No. 10/580,704, mailed Jun. 16, 2008, 10 pages.

(Continued)

*Primary Examiner* — Ahshik Kim
(74) *Attorney, Agent, or Firm* — Osha • Liang LLP

(57) ABSTRACT

To provide an IC-tagged bearing device, in which difficulties brought about by reflection and/or absorption of radio waves upon and/or in raceway members or the like can be avoided, information recording can be accomplished satisfactorily, an IC tag itself does not require an antenna, and the IC tag can have a compact, yet large capacity. The bearing device, having a bearing space delimited between inner and outer races (1, 2) and sealed by a sealing member (5), includes an IC tag (9) which utilizes a core metal (6) as an antenna and which is fitted to the sealing member (5). The sealing member (5) is made of a rubber material or a synthetic resin having the core metal (6).

4 Claims, 6 Drawing Sheets

U.S. PATENT DOCUMENTS

| | | | |
|---|---|---|---|
| 6,246,327 | B1 | 6/2001 | Eberhardt |
| 6,607,135 | B1 * | 8/2003 | Hirai et al. ............... 235/487 |
| 6,662,062 | B1 | 12/2003 | Bjornson et al. |
| 7,249,891 | B2 * | 7/2007 | Aoki et al. ............... 384/448 |
| 7,534,045 | B2 * | 5/2009 | Nakajima et al. .......... 384/448 |
| 2004/0075616 | A1 | 4/2004 | Endo et al. |
| 2007/0126587 | A1 * | 6/2007 | Nakajima et al. .......... 340/572.8 |

FOREIGN PATENT DOCUMENTS

| | | |
|---|---|---|
| JP | 2002-290131 A | 10/2002 |
| JP | 2002-298116 | 10/2002 |
| JP | 2003-227526 | 8/2003 |
| JP | 2004-263724 | 9/2004 |
| JP | 2005-42895 | 2/2005 |
| WO | WO-02/101675 | 12/2002 |

OTHER PUBLICATIONS

Japanese Office Action for Japanese Patent Application No. 2003-393361, Mailing Date: Jun. 23, 2009, 3 pages.
Patent Abstracts of Japan for Japanese Patent Application with Publication No. 2002-155933, Publication Date: May 31, 2002, 1 page.
Patent Abstracts of Japan for Japanese Patent Application with Publication No. 2003-227526, Publication Date: Aug. 15, 2003, 1 page.
Patent Abstracts of Japan for Japanese Patent Application with Publication No. 2005-042895, Publication Date: Feb. 17, 2005, 1 page.
Decision of Rejection for Japanese patent application No. 2003-393361, dated Nov. 4, 2009. (2 pages).
Patent Abstracts of Japan for Japanese Patent Application with Publication No. 2002-290131, Publication Date: Oct. 4, 2002, 1 page.

* cited by examiner

Fig. 1A
Fig. 1B
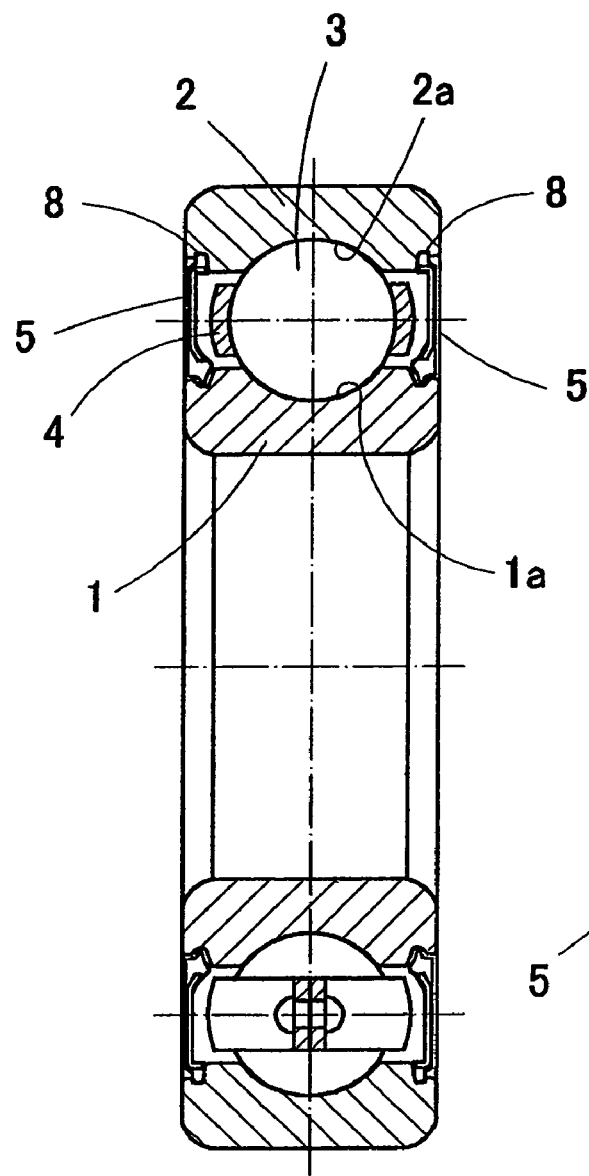
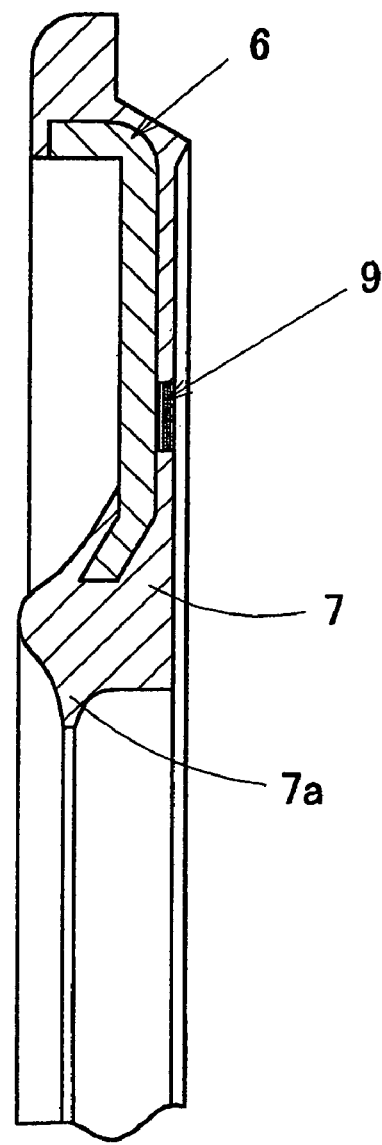

BEARING WITH IC TAG AND SEAL FOR THE SAME

FIELD OF THE INVENTION

The present invention relates to a bearing device having incorporated therein an IC tag capable of performing communication on a non-contact basis and a sealing member therefor.

BACKGROUND ART

It has hitherto been a general practice for the bearing device to have the model number, precision code, special requirement code and manufacturing lot number marked in the product itself or printed in a package thereof. However, the contents that can be born in the bearing device and/or the package thereof are limited to the minimum.

As IC tags which are affixed to various products and which are compact in size and capable of recording a large amount of information therein, various IC tags for use in radio frequency identification (RFID) have hitherto been developed, which utilizes the RFID technology. (See, for example, the Japanese Laid-open Patent Publication No. 2002-298116.)

However, the bearing identification information represented by the numbering conventionally marked in the packages containing bearing devices has a problem in that it tends to be lost or become illegible after the bearing device has been assembled. The markings made in the respective bearing devices contain so small an amount of information marked, that individual identification of those bearing devices may not be possible to achieve.

In view of the foregoing, attempts have been made to affix an RFID-based IC tag capable of accommodating a large amount of information directly to each of the bearing devices. However, since the RFID-based IC tag makes use of microwaves, mounting of the RFID-based IC tag on a bearing device makes it impossible for the RFID-based IC tag to be read out because during the information reading raceway members of the bearing device absorbs the microwaves. In other words, if the IC tag having an antenna was mounted directly on an inner race or an outer race of the bearing device, troubles occur as a result of the microwaves being absorbed in the inner and outer race of the bearing device, which are made of metal other than the antenna, and/or other metallic members such as, for example, a bearing housing when the bearing device is incorporated in a real machine. For this reason, it often occurs that difficulty is encountered in reading the information recorded on the IC tag. Although the IC tag itself is available, which is so designed as to be affixed directly to metallic components, such tag is expensive and bulky.

Also, the bearing devices are varying in size (small or large) and thickness (thin or thick) and have a limited space for accommodating the respective IC tag. Because of this, the IC tags, which are ultra small in size and small in thickness, are desired. As the RFID-based IC tag, the RFID-based IC tag disclosed in the Japanese patent publication referred to above makes use of a spirally coiled antenna as an antenna and, therefore, cannot be designed to have a reduced size in a widthwise direction thereof. Although IC tags, including an antenna, designed to be ultra small in size have been suggested, those IC tags have some performance factors such as, for example, information recording capacity sacrificed in the face of compactization and, therefore, it is quite often experienced that a desired amount of information cannot be recorded.

DISCLOSURE OF THE INVENTION

An object of the present invention is to provide an IC-tagged bearing device, i.e., a bearing device with an IC tag incorporated therein, in which difficulties brought about by reflection and/or absorption of radio waves upon and/or in raceway members or the like can be avoided and in which information recording can be accomplished satisfactorily, and a sealing member for use therein.

An sealing member for use in an IC-tagged bearing device according to the present invention is of a structure fitted to the bearing device for sealing a bearing space delimited between mutually confronting raceway members of the bearing device, and which is made of rubber or resinous elastic element equipped with a core metal, the elastic element being adapted to engage the raceway members, and wherein an IC tag is fitted to the core metal serving as antenna.

According to the present invention, since the core metal of the sealing member is utilized as an antenna, there is no need to provide the IC tag with an antenna and IC tag can be made compact and can have a large storage capacity. For this reason, even with a small sealing member, no problem occur as to the mounting space enough to allow it to be an IC-tagged sealing member. Also, where the sealing member is fitted to the bearing device, the core metal is insulated from the raceway members in the presence of a rubber or resin portion of the sealing member and, therefore, difficulty resulting from absorption and reflection of radio waves in and from the raceway member can be avoided, allowing information stored in the IC tag to be read out satisfactorily.

The IC-tagged bearing device according to one aspect of the present invention includes the sealing members referred to above and the elastic element referred to above is interposed between the core metal and the raceway members. According to this aspect, absorption and reflection of radio waves in and from the raceway member can be likewise avoided, allowing information stored in the IC tag to be read out satisfactorily. Also, since the IC tag itself does not require an antenna, the IC tag can have a compact size and a large capacity. In addition, since the IC tag is fitted to the sealing member, the manufacture thereof is easy to accomplish as compared with the case in which it is fitted to the raceway member.

The IC-tagged bearing device according to another aspect of the present invention is a bearing, in which the bearing space delimited between the raceway members is sealed by a non-contact type sealing member made of metallic material and an antenna-equipped IC tag is fitted to the sealing member through an insulating piece.

In the case of the non-contact type metallic sealing member, the sealing member is fitted to one of the raceway members, which it is to be fitted to, in metal-to-metal contact fashion and, therefore, if the antenna-equipped IC tag is fitted directly to the non-contact type sealing member, a problem would arise in difficulty reading information because of absorption of radio waves. However, when the antenna-equipped IC tag is fitted through the insulating piece such as achieved in the present invention, information reading from the IC tag can be accomplished satisfactorily without accompanying difficulty resulting from absorption of radio waves in the raceway members.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

FIG. 1A is a longitudinal sectional view of an IC-tagged bearing device according to a first preferred embodiment of the present invention;

FIG. 1B is a longitudinal sectional view, showing on an enlarged scale a sealing member employed in the IC-tagged bearing device shown in FIG. 1A;

BEST MODE FOR CARRYING OUT THE INVENTION

Figure 2:
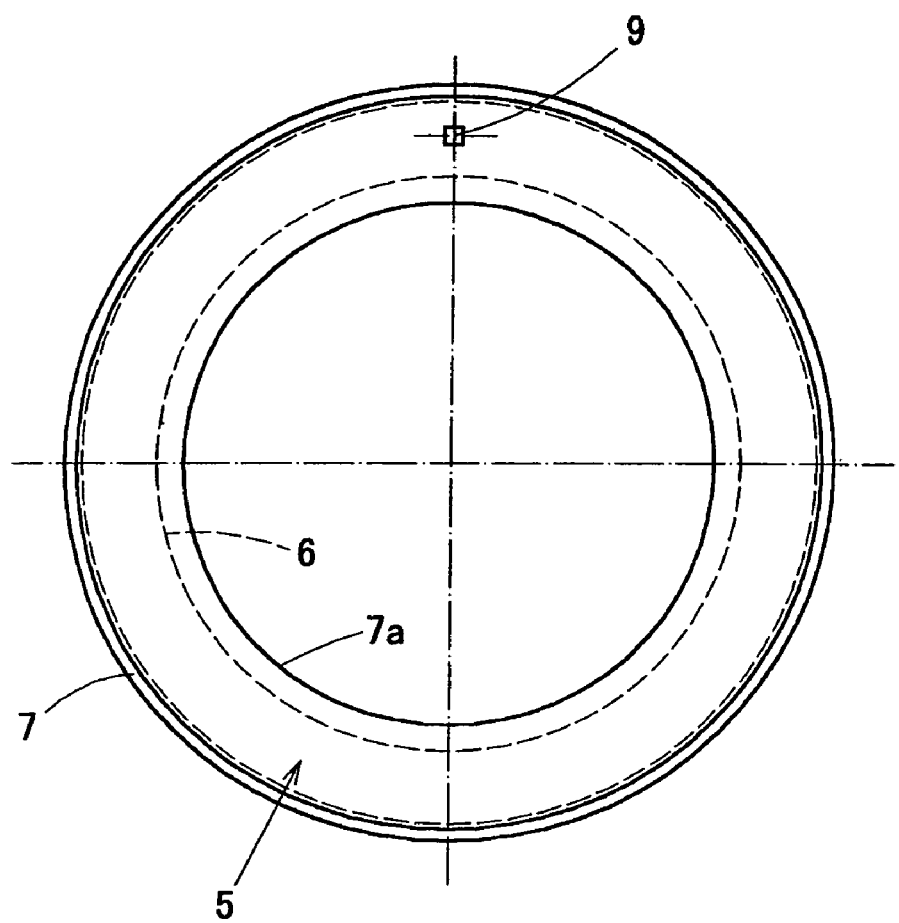
FIG. 2 is a front end view of the sealing member in the IC-tagged bearing device shown in FIG. 1A.

The first preferred embodiment of the present invention will be described in detail with particular reference to FIGS. 1 to 3. An IC-tagged bearing device shown therein includes inner and outer races 1 and 2, which are respective raceway members and which have respective raceway surfaces 1a and 2a defined therein, rolling elements 3 interposed between the raceway surfaces 1a and 2a, a retainer 4 for retaining the rolling elements 3 in a circular row, and a sealing member fitted to each end of the bearing device. The rolling elements 3 are in the form of a ball and the illustrated bearing device is in the form of a deep groove ball bearing.

The sealing member 5 is in the form of a contact seal of a kind, in which a rubber-like elastic element 7 forming a sealing member and having an electric insulating property is provided in a core metal 6, and is shaped to represent a ring shape. The sealing member 5 is fitted to either one of the inner and outer races 1 and 2 opposed to each other in a radial direction and is used to seal a bearing space delimited between the inner and outer races 1 and 2. The elastic element 7 is made of an elastically deformable material having a modulus of elasticity lower than that of a metallic material such as, for example, iron or stainless steel and is preferably made of rubber or resin. In the illustrated instance, the sealing member 5 has its outer peripheral edges engaged in a seal fitting groove 8 defined in an inner peripheral surface of the outer race 2, with a sealing lip 7a in an inner peripheral portion of the elastic element 7 held in sliding engagement with an outer peripheral surface of the inner race 1. The core metal 6 is in the form of a ring-shaped press-worked metal plate such as, for example, a steel plate having an electric conductivity. The core metal 6 may be covered in its entirety with the rubber-like elastic element 7 or may have a part thereof exposed to the outside through the rubber-like elastic element 7, but the core metal 6 should not be exposed to the outside at a portion where the sealing member 5 is held in contact with any raceway member, that is, the inner and outer races 1 and 2 and should not be held in contact with any raceway member. In the illustrated embodiment, one of opposite surfaces of the core metal 6 confronting outwardly of the bearing device is covered in its entirety with the rubber-like elastic element 7. Accordingly, an IC tag 9 is protected with the elastic element 7.

The IC tag 9 referred to above makes use of the core metal 6 as an antenna and is secured to the sealing member 5. The IC tag 9 is fitted to that surface of the core metal 6, which confronts outwardly of the bearing device, and is embedded in the rubber-like elastic element 7. This IC tag 9 may be covered in its entirety with the rubber-like elastic element 7 or may have a portion thereof exposed at that surface of the rubber-like elastic element 7. This IC tag 9 is bonded to the core metal 6 with the use of an electroconductive bonding agent so that a connecting terminal of the antenna of the IC tag 9 can be electrically connected with the core metal 6. The IC tag 9 is of a size corresponding to, for example, a few or more fractions of the width of the sealing member 5 which is represented by the distance between the inner and outer diameters of the sealing member 5.

For the IC tag 9, a RFID-based IC tag operable based on, for example, the RFID technology can be suitably used. This RFID-based IC tag is available in various types which utilize, as a transmission system, electrostatic coupling, electromagnetic coupling, electromagnetic induction, radio waves such as, for example, microwaves, and light, but the RFID-based IC tag operable with radio waves such as, for example, microwaves is employed.

Figure 3:
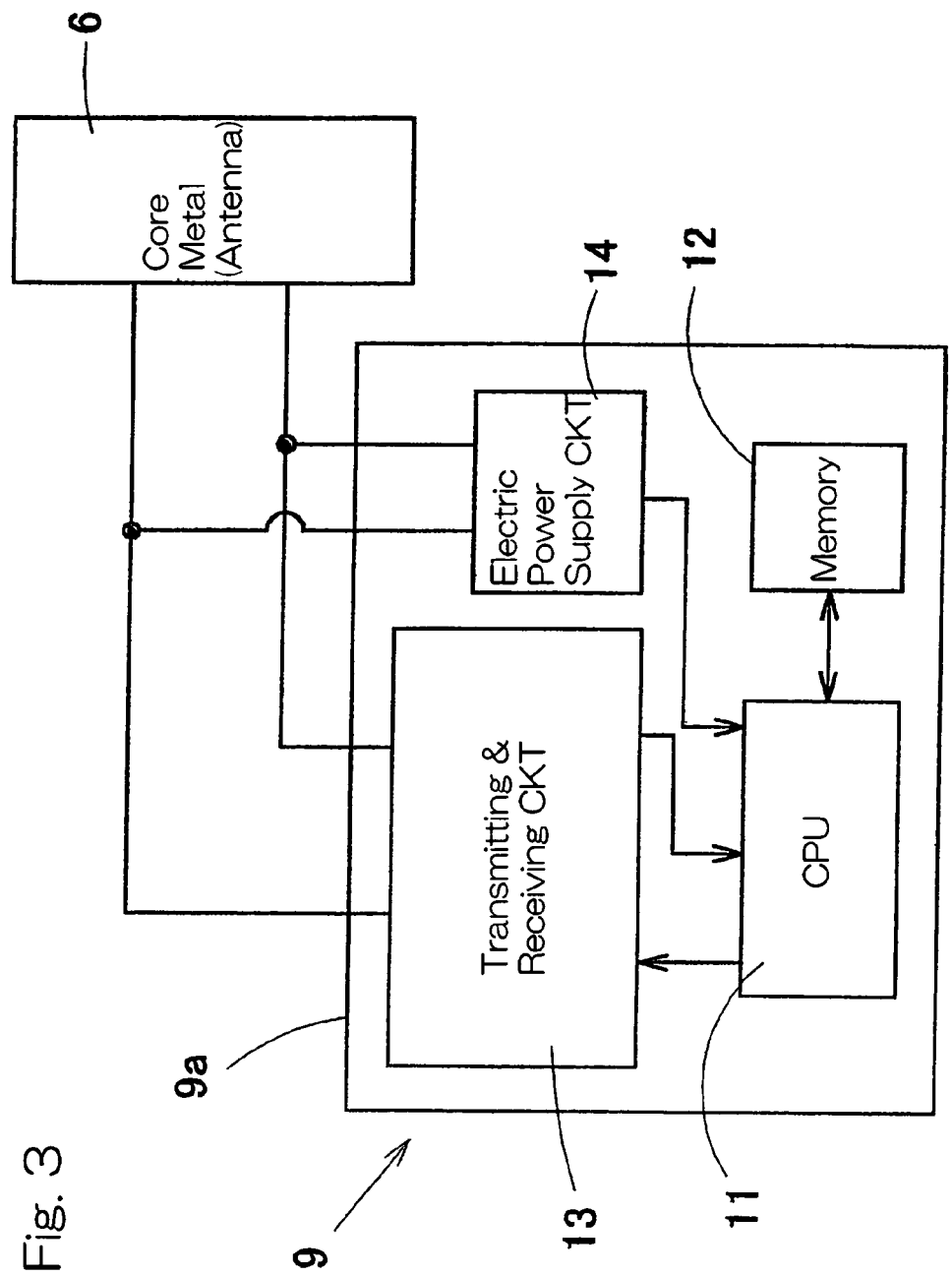
FIG. 3 is a circuit block diagram showing an electric circuit for the IC-tag employed in the IC-tagged bearing device.

FIG. 3 illustrates a circuit block diagram showing the electric circuit usable with the IC tag 9. The IC tag 9 employed in the practice of the present invention includes, for example, an independent IC chip 9a made up of a central processing unit (CPU) 11, a memory 12, a transmitting and receiving circuit 13 and electric power supply circuit 14 capable of capturing an electric power through the antenna. The memory 12 is of a kind that does not require any electric power to store information therein. For the antenna of the IC tag 9, the core metal 6 provided in the sealing member 5 is employed. It is, however, to be noted that the IC tag 9 may be of a kind utilizing an internal antenna (not shown) separate from the core metal 6, with the core metal 6 used as an external antenna that is used in combination with the internal antenna. Information recording and reading in relation to the IC tag 9 is accomplished by utilizing an IC tag reader/writer having an antenna cooperable with the antenna or core metal 6 of the IC tag 9.

According to the IC-tagged bearing device of the structure described above, the core metal 6 of the sealing member 5 is utilized as an antenna and, therefore, the use of a dedicated antenna in the IC tag 9 can advantageously be dispensed with and the IC tag 9 can be compact in size and have a large capacity of storing the information. Since the core metal 6 is electrically insulated from the inner and outer races 1 and 2 in the presence of the rubber-like elastic element 7 of the sealing member 5, undesirable absorption and reflection of radio waves in and from any of the inner and outer races 1 and 2 and, for example, a housing accommodating the bearing device and reading of the information stored in the IC tag 9 can be accomplished satisfactorily.

As hereinbefore described, since the IC tag 9 can have a large information storing capacity, it can be used for recording of various pieces of information. The information to be stored in the IC tag 9 provided in the bearing device according to the present invention may include, for example, some or all of the kind of grease used in the bearing device, precision of, for example, the gap in the bearing device, material types, hardness and heat treatment conditions of component parts of the bearing device, diameter and class of the rolling element, type of the sealing member, manufacturing lot number, manufacturing history, result of inspection, history on sales channels, maintenance information and others, and can be read out from the IC tag 9 after the bearing device has completely been assembled into a machine.

Figure 4A:
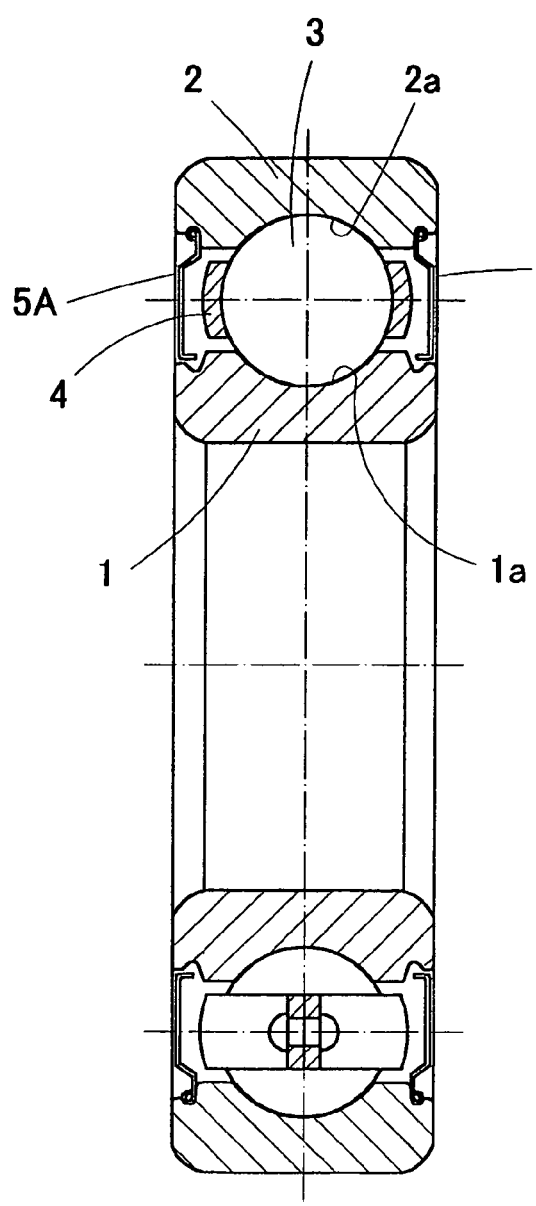
FIG. 4A is a longitudinal sectional view of an IC-tagged bearing device according to a second preferred embodiment of the present invention.
Figure 4B:
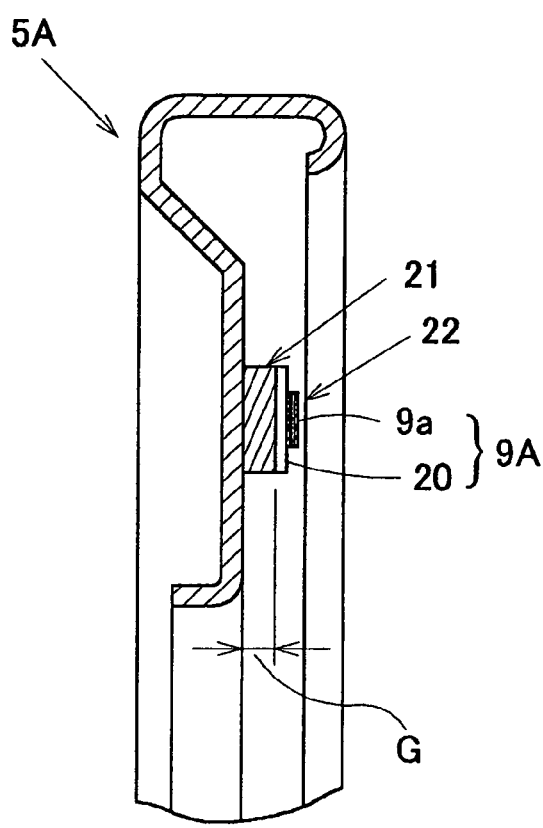
FIG. 4B is a longitudinal sectional view, showing on an enlarged scale the sealing member employed in the IC-tagged bearing device shown in FIG. 4A.
Figure 5:
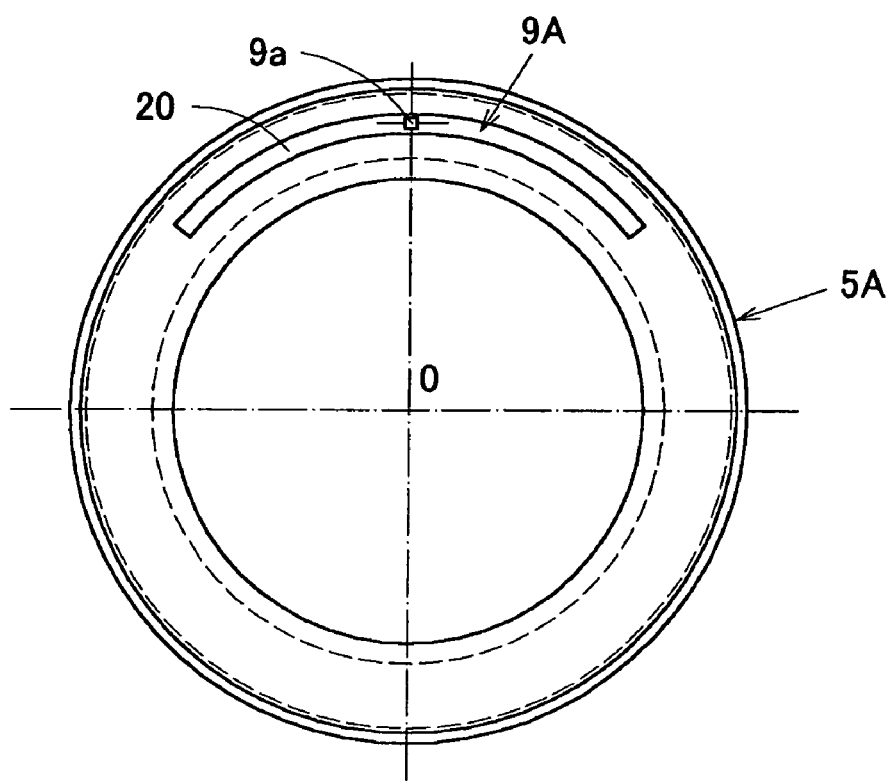
FIG. 5 is a front end view of the sealing member in the IC-tagged bearing device shown in FIG. 4A.
Figure 6:
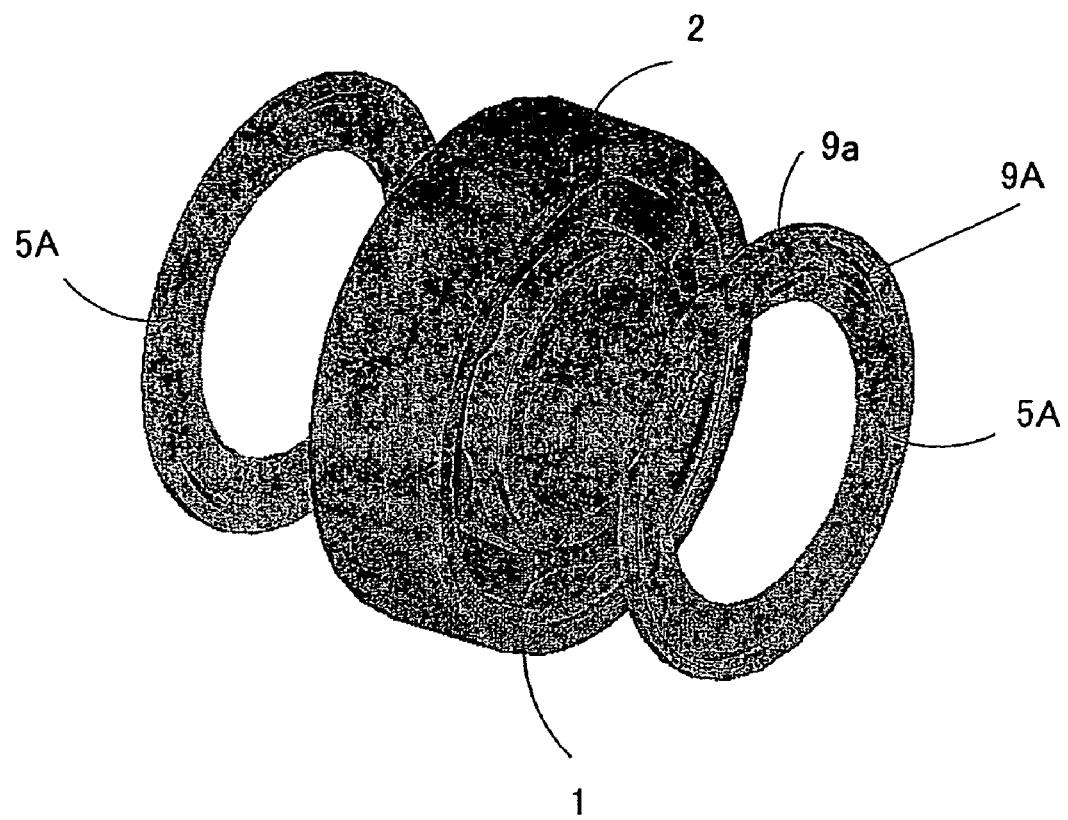
FIG. 6 is an exploded view of the IC-tagged bearing assembly shown in FIG. 4A.

FIGS. 4 to 6 illustrates a second preferred embodiment of the present invention. The IC-tagged bearing device shown therein is similar to that shown in and described with reference to FIGS. 1 to 3 in connection with the first embodiment, but differ therefrom in that in place of the contact type sealing member 5 used in the bearing device according to the previously described embodiment, a non-contact type sealing member 5A made of metallic material is employed. This non-contact type sealing member 5A is in the form of a press-worked metallic member such as, for example, steel plate shaped by the use of a press work and is often referred to as a shield. In this embodiment, the antenna-equipped IC tag 9A is secured to this electroconductive sealing member 5A through an electrically insulating piece 21. The IC tag 9A employed therein is secured in this manner to one of opposite surfaces of the sealing member 5A that confronts outwardly of the bearing device. The electrically insulating piece 21 may be of any material, for example, synthetic resin, provided that it can provide a gap G between the sealing member 5A and the antenna 20 of the IC tag 9A, which gap G is effective to avoid an magnetic interference therebetween.

The antenna-equipped IC tag 9A is made up of an IC chip 9a and the antenna 20. The IC chip 9a is of a structure shown in and described with reference to FIG. 3. The antenna 20 is in the form of, for example, an arcuate metallic plate extending in a direction circumferentially of the sealing member 5A, and the IC chip 9a is bonded to this antenna 20 by the use of a bonding agent. This bonding is accomplished by the use of, for example, an electroconductive bonding agent so that a connecting terminal of the antenna of the IC chip 9a can be electrically connected with the antenna 20. The antenna 20 has a width or its mounting position that is so chosen that it can be separated from any of the inner and outer races 1 and 2 in the bearing devices a distance corresponding to ⅓ or more of the width of the sealing member 9A represented by the distance between the inner and outer diameters of the sealing member 5.

The electrically insulating piece 21 shown in FIG. 4B is provided over the entire rear surface of the antenna 20 and is bonded to the antenna 20. By way of example, an insulator-equipped IC tag 22 of a unitary structure in which the antenna 20, the IC chip 9a and the electrically insulating piece 21 are all integrated together is bonded to the sealing member 5A.

Since other structural features of the bearing device in this second embodiment are similar to those of the bearing device in the first embodiment, like parts are shown by like reference numerals. FIG. 5 illustrates a front elevational view of FIG. 4B.

According to the foregoing second embodiment, since the antenna-equipped IC tag 9A is fitted through the electrically insulating piece 21, reading of the information from the IC tag 9A can be accomplished satisfactorily without absorption of radio waves taking place from, for example, any of the inner and outer races 1 and 2.

Although in describing any of the first and second embodiments of the present invention, reference has been made to the deep groove ball bearing, the present invention can be equally applied to any type of bearing equipped with the sealing member. By way of example, the present invention is equally applicable to a radial bearing such as, for example, a cylindrical roller bearing, a tapered roller bearing, self-aligning bearing, angular contact ball bearing and center bearing and also to a thrust bearing. Also, the present invention is equally applicable to any other special bearing such as, for example, a wheel support bearing for cars and for any special use. The IC-tagged bearing device according to the present invention may not necessarily be of a type including a pair of raceway members as an independent bearing, but may be of a type in which one of the inner and outer raceway members is omitted, but a shaft or a housing of a machine utilizing the bearing serves as the other of the raceway members.

What is claimed is:

1. A sealing member for use in an IC-tagged bearing device, which is fitted to the bearing device for sealing a bearing space delimited between mutually confronting raceway members of the bearing device, and which is made of rubber or resinous elastic element equipped with a core metal, the elastic element being adapted to engage the raceway members, and wherein an IC tag is fitted to the core metal serving as antenna.

2. The sealing member for use in the IC-tagged bearing device as claimed in claim 1, wherein the IC tag is fitted to one of opposite surfaces of the core metal oriented outwardly of the bearing device and wherein that surface of the core metal is covered in its entirety with the elastic element except for a portion thereof occupied by the IC tag.

3. An IC-tagged bearing device provided with a sealing member fitted to the bearing device for sealing a bearing space delimited between mutually confronting raceway members of the bearing device, and which is made of rubber or resinous elastic element equipped with a core metal, the elastic element being adapted to engage the raceway members, wherein an IC tag is fitted to the core metal serving as antenna, and wherein the elastic element is interposed between the core metal and the raceway members.

4. An IC-tagged bearing device having a bearing space delimited between raceway members, which space is sealed by a non-contact type sealing member made of metallic material, an antenna-equipped IC tag being fitted to the sealing member through an insulating piece.

* * * * *